United States Patent
Yoshioka et al.

(10) Patent No.: US 11,961,719 B2
(45) Date of Patent: Apr. 16, 2024

(54) VACUUM PROCESSING METHOD

(71) Applicant: Hitachi High-Tech Corporation, Tokyo (JP)

(72) Inventors: Nozomu Yoshioka, Tokyo (JP); Kazumasa Okuma, Tokyo (JP); Takao Arase, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/435,127

(22) PCT Filed: Jun. 25, 2020

(86) PCT No.: PCT/JP2020/024933
§ 371 (c)(1),
(2) Date: Aug. 31, 2021

(87) PCT Pub. No.: WO2021/260869
PCT Pub. Date: Dec. 30, 2021

(65) Prior Publication Data
US 2023/0122903 A1    Apr. 20, 2023

(51) Int. Cl.
*H01J 37/32*    (2006.01)
*H01L 21/02*    (2006.01)
*H01L 21/311*    (2006.01)

(52) U.S. Cl.
CPC .. *H01J 37/32862* (2013.01); *H01L 21/02186* (2013.01); *H01L 21/31122* (2013.01); *H01J 2237/3341* (2013.01)

(58) Field of Classification Search
CPC ..... B08B 13/00; B08B 3/02; H01L 21/67034; H01L 21/67253
See application file for complete search history.

(56) References Cited

U.S. PATENT DOCUMENTS 5,709,757 A    1/1998  Hatano et al.
5,817,578 A * 10/1998  Ogawa .............. H01L 21/67069
                                              134/1.1
(Continued)

FOREIGN PATENT DOCUMENTS

CN    110402482 A    11/2019
JP    H05-042990 A    2/1993
(Continued)

OTHER PUBLICATIONS

Office Action dated Mar. 15, 2022 in Japanese Application No. 2021-524468.
(Continued)

*Primary Examiner* — Erin F Bergner
(74) *Attorney, Agent, or Firm* — Miles & Stockbridge, P.C.

(57) ABSTRACT

Provided is a vacuum processing method capable of preventing particles from adhering to a wafer due to a titanium (Ti)-based reaction product. The vacuum processing method is applicable to a plasma processing apparatus including: a sample stage disposed in a processing chamber inside a vacuum container, on which a wafer having a titanium (Ti)-containing film is placed; a coil supplied with a radio frequency power for forming plasma in the processing chamber; and a heating device that emits an electromagnetic wave for heating the wafer placed on an upper surface of the sample stage. The vacuum processing method includes a step of etching the titanium (Ti)-containing film, and a step of cleaning an inside of the processing chamber by using a mixed gas of nitrogen trifluoride ($NF_3$) gas, argon gas, and a chlorine gas.

5 Claims, 3 Drawing Sheets

(56) References Cited

U.S. PATENT DOCUMENTS

| | | | |
|---|---|---|---|
| 6,319,327 | B1 | 11/2001 | Tsukada et al. |
| 6,815,362 | B1 | 11/2004 | Wong et al. |
| 7,204,913 | B1 | 4/2007 | Singh et al. |
| 8,557,709 | B2 | 10/2013 | Sumiya et al. |
| 8,767,166 | B2 | 7/2014 | Kubota et al. |
| 2003/0005943 | A1 | 1/2003 | Singh et al. |
| 2003/0056388 | A1 | 3/2003 | Ohno et al. |
| 2003/0176069 | A1 | 9/2003 | Yuasa et al. |
| 2004/0014327 | A1 | 1/2004 | Ji et al. |
| 2004/0069610 | A1* | 4/2004 | Arno ............... B08B 7/0035 422/186.3 |
| 2004/0235303 | A1 | 11/2004 | Wong et al. |
| 2006/0234512 | A1 | 10/2006 | Yuasa et al. |
| 2009/0068844 | A1 | 3/2009 | Pischtiak et al. |
| 2011/0114130 | A1 | 5/2011 | Kang et al. |
| 2011/0265813 | A1 | 11/2011 | Okai et al. |
| 2013/0087174 | A1 | 4/2013 | Sun et al. |
| 2014/0166049 | A1 | 6/2014 | Kang et al. |
| 2017/0194561 | A1 | 7/2017 | Suyama et al. |
| 2017/0229290 | A1 | 8/2017 | Kobayashi et al. |
| 2018/0076051 | A1 | 3/2018 | Shinoda et al. |
| 2018/0082855 | A1 | 3/2018 | Sasaki et al. |
| 2019/0237302 | A1 | 8/2019 | Kobayashi et al. |
| 2021/0151298 | A1 | 5/2021 | Kobayashi et al. |

FOREIGN PATENT DOCUMENTS

| | | |
|---|---|---|
| JP | H08115886 A | 5/1996 |
| JP | H09-048690 A | 2/1997 |
| JP | H11-168092 A | 6/1999 |
| JP | 2000-150387 A | 5/2000 |
| JP | 2001-044186 A | 2/2001 |
| JP | 2003273082 A | 9/2003 |
| JP | 2006173301 A | 6/2006 |
| JP | 2008-053456 A | 3/2008 |
| JP | 2008-060171 A | 3/2008 |
| JP | 2009533853 A | 9/2009 |
| JP | 2011-100820 A | 5/2011 |
| JP | 2011-192872 A | 9/2011 |
| JP | 2012-243958 A | 12/2012 |
| JP | 2016-066801 A2 | 4/2016 |
| JP | 2017-063186 A | 3/2017 |
| JP | 2017143186 A | 8/2017 |
| JP | 2018-046216 A | 3/2018 |
| JP | 2018041886 A | 3/2018 |
| KR | 100221899 B1 | 9/1999 |
| KR | 10-2002-0032581 A | 5/2002 |
| KR | 2009-0015054 A | 2/2009 |
| KR | 2011-0054287 A | 5/2011 |
| TW | 200402458 A | 2/2004 |
| TW | 201117892 A | 6/2011 |
| TW | 201207520 A | 2/2012 |
| TW | 201217500 A | 5/2012 |
| TW | 201546876 A | 12/2015 |
| TW | 201714312 A | 4/2017 |

OTHER PUBLICATIONS

Office Action dated May 24, 2022 in Taiwanese Application No. 110122756.
Search Report dated Jul. 21, 2020 in International Application No. PCT/JP2020/024933.
Written Opinion dated Jul. 21, 2020 in International Application No. PCT/JP2020/024933 .
Office Action dated Aug. 9, 2022 in Japanese Application No. 2021-524468.
Office Action dated Aug. 10, 2022 in Korean Application No. 10-2021-7027244.
Office Action dated Feb. 9, 2018 in Korean Application No. 10-2017-0004059.
Search Report dated Aug. 3, 2021 in International Application No. PCT/JP2021/020226.
Written Opinion dated Aug. 3, 2021 in International Application No. PCT/JP2021/020226.
Office Action dated Oct. 3, 2017 in Taiwanese Application No. 106102963.
Office Action dated Nov. 29, 2017 in U.S. Appl. No. 15/443,578.
Office Action dated Apr. 3, 2018 in U.S. Appl. No. 15/443,578.
Office Action dated Nov. 26, 2018 in U.S. Appl. No. 15/443,578.
Office Action dated Jun. 6, 2019 in U.S. Appl. No. 15/443,578.
Office Action dated Mar. 12, 2020 in U.S. Appl. No. 15/443,578.
Office Action dated Oct. 1, 2020 in U.S. Appl. No. 15/443,578.
Office Action dated May 18, 2021 in U.S. Appl. No. 15/443,578.
Office Action dated Nov. 29, 2021 in U.S. Appl. No. 15/443,578.
Office Action dated Jul. 25, 2022 in U.S. Appl. No. 15/443,578.
Search Report dated Aug. 17, 2021 in International Application No. PCT/JP2021/023318.
Written Opinion dated Aug. 17, 2021 in International Application No. PCT/JP2021/023318.
Office Action mailed Aug. 28, 2023 in Korean Application No. 10-2021-7027244.

* cited by examiner

[FIG. 1]
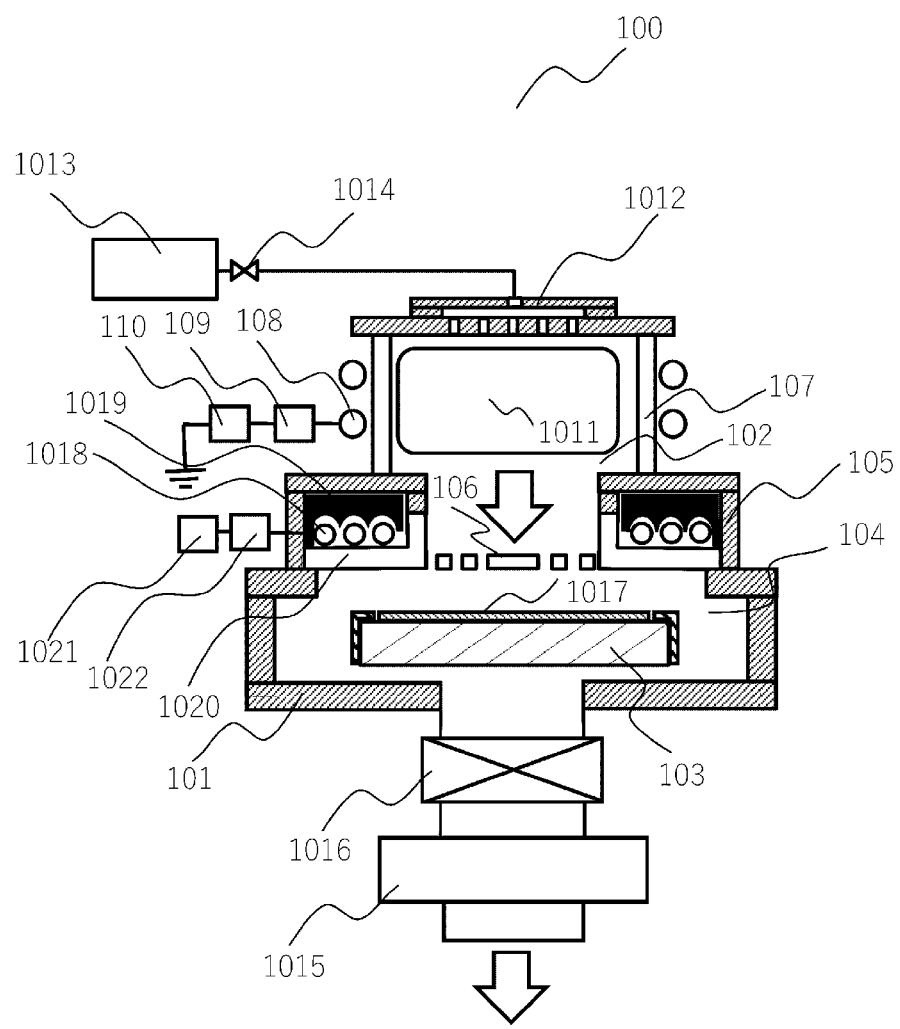

[FIG. 2]
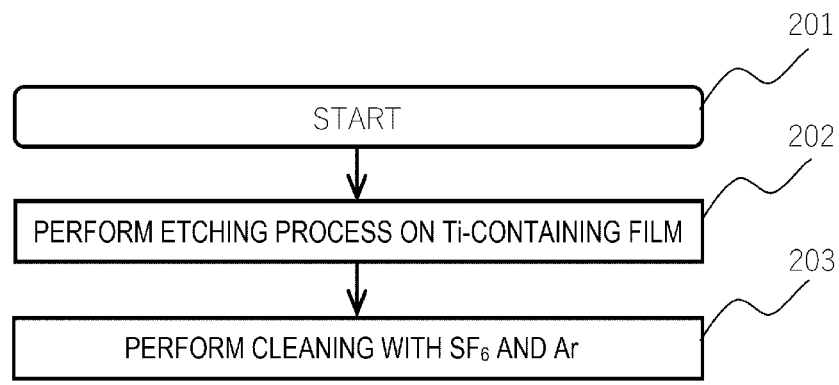
[FIG. 3]
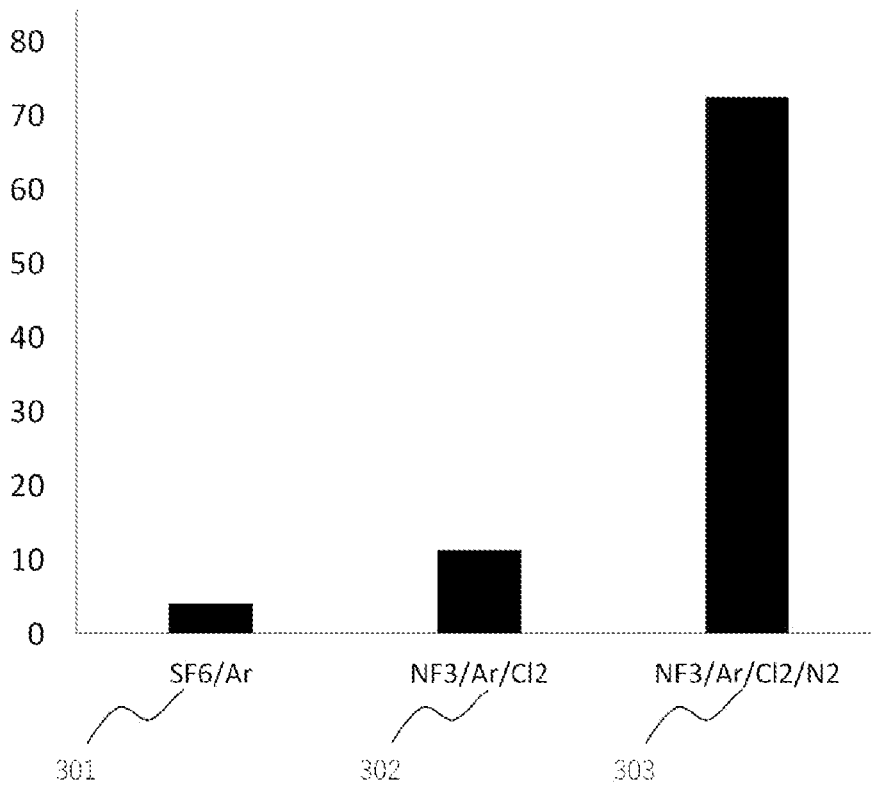

[FIG. 4]
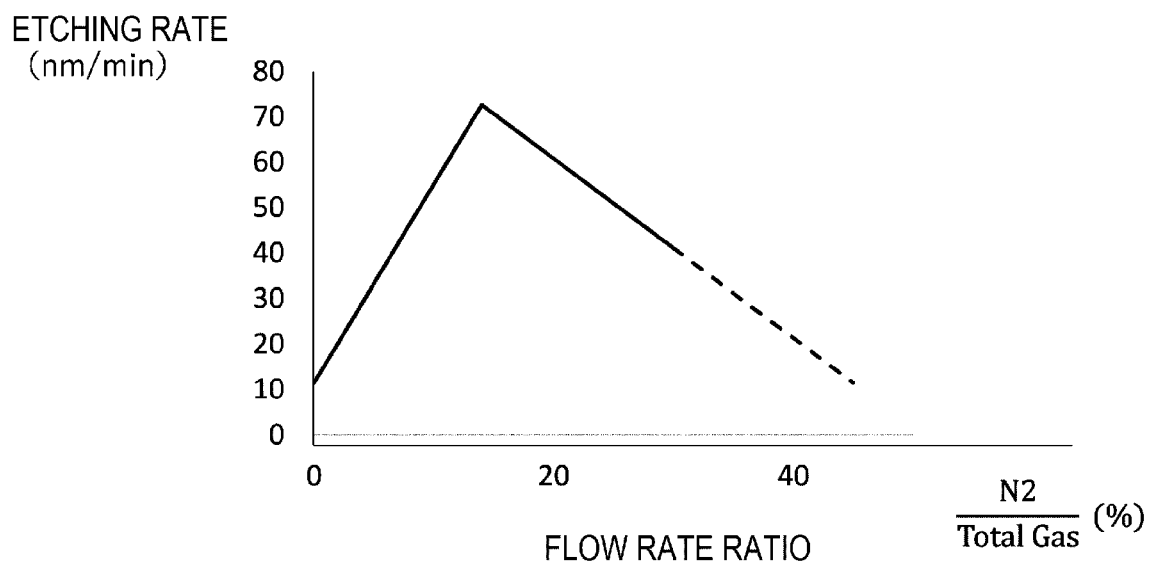
[FIG. 5]
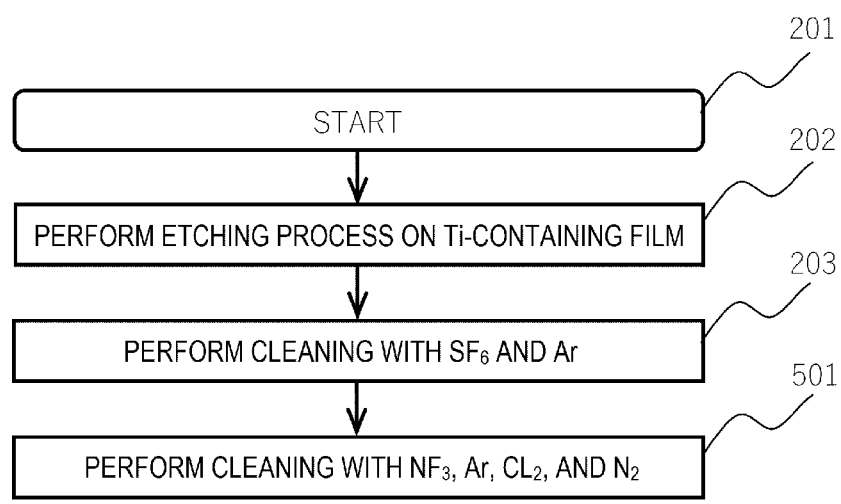

VACUUM PROCESSING METHOD

TECHNICAL FIELD

The present invention relates to a vacuum processing method.

BACKGROUND ART

In a manufacturing process of a semiconductor device, it is required to achieve miniaturization and integration of components included in the semiconductor device. For example, nanoscale of a structure is further promoted in an integrated circuit and a nano-electromechanical system.

Generally, in the manufacturing process of the semiconductor device, a lithography technique is used to form micropatterns. In this technique, a pattern of a device structure is applied on a resist layer, and a substrate exposed by the pattern of the resist layer is selectively removed by etching. In a subsequent processing step, an integrated circuit can be formed by depositing other materials in an etching region.

As a related art, PTL 1 discloses a processing device that performs an atomic-layer etching process in an adsorption/desorption mode in order to perform isotropic etching with high accuracy by a dry processing.

According to the processing device in this related art, a reaction layer generating step by radicals and a reaction layer removing step by infrared heating are performed on a wafer placed on a stage disposed in a processing chamber inside a vacuum container. In the reaction layer generating step, at first, a processing gas is supplied to a radical generation space in an upper portion of the processing chamber so as to generate radicals by activating the gas. The formed radical particles are supplied to an upper surface of the wafer placed in the processing chamber through a gas introduction pipe communicating with a lower portion of the processing chamber so as to generate a reaction layer therein.

Further, the reaction layer removing step is performed after the reaction layer generating step, and infrared light is irradiated from a lamp disposed on an upper portion of the wafer to vaporize a product on the upper surface of the wafer and remove the reaction layer. By alternately repeating these steps, a film as a processing target on a wafer surface is removed.

In the etching processing step, there is a problem that a reaction product is generated in various steps and adheres to or deposits in the processing chamber. In particular, the reaction product often adheres to and deposits on a chamber inner wall, a stage surface, and a susceptor ring disposed near the wafer in the processing chamber.

Adhesion and deposition of the reaction product cause various problems in etching performance of the processing device. For example, as an influence on the wafer, the reaction product remains in the processing chamber during the etching processing step, and the reaction product adhering to and depositing in the processing chamber during an etching step is scattered on the device to become particles, which cause a pattern defect or lead to a variation in machining dimensions of the device due to a change over time, and thus a desired performance cannot be exhibited. In addition, as an influence on the processing device, the reaction product deposits on the stage surface, which causes performance degradation such as an electrostatic adsorption failure.

In order to restrain these problems, it is required to remove the reaction product by periodic cleaning. As described in PTL 2, a method is widely known as a typical cleaning method, in which highly reactive halogen radicals are generated by a mixed gas of sulfur hexafluoride ($SF_6$) gas and argon (Ar) gas, and are reacted with deposits to vaporize the reaction product, and the reaction product is exhausted to the outside of the vacuum container so as to be removed.

CITATION LIST

Patent Literature

PTL 1: JP-A-2017-143186
PTL 2: JP-A-2003-273082

SUMMARY OF INVENTION

Technical Problem

However, the related cleaning method described above has the following problems. When a titanium (Ti)-containing film wafer is subjected to the etching processing, a titanium (Ti)-based reaction product is generated and easily adheres to and deposits in the processing chamber inside the vacuum container as described above. However, in the cleaning method of the related art by using a mixed gas of sulfur hexafluoride ($SF_6$) gas and argon (Ar) gas, reactivity with a silicon (Si)-based reaction product is high while reactivity with the titanium (Ti)-based reaction product is low. Therefore, a removal effect of the silicon (Si)-based reaction product is high, while the titanium (Ti)-based reaction product remains adhered to and deposited in the processing chamber without being removed.

In particular, since the stage surface and the susceptor ring are disposed near the wafer, the titanium (Ti)-based reaction product generated by the processing step easily adheres and deposits, and is scattered on the wafer, thereby causing a problem that particles frequently occur.

An objective of the present invention is to provide a vacuum processing method capable of preventing particles from adhering to a wafer due to a titanium (Ti)-based reaction product.

Solution to Problem

In order to solve the above problems, one of typical vacuum processing methods according to the present invention is a vacuum processing method for etching a titanium-containing film in a processing chamber. The method is achieved by including:
  a step of etching the film, and
  a step of cleaning an inside of the processing chamber by using a mixed gas of nitrogen trifluoride ($NF_3$) gas, argon (Ar) gas, and chlorine ($Cl_2$) gas.

Advantageous Effect

According to the present invention, it is possible to provide a vacuum processing method capable of preventing particles from adhering to a wafer due to a titanium (Ti)-based reaction product.

Problems, configurations and effects other than those described above will be clarified by the following description of embodiments.

BRIEF DESCRIPTION OF DRAWINGS

FIG. 1 is a longitudinal cross-sectional view schematically illustrating a configuration of a plasma processing apparatus according to an embodiment of the present invention.

FIG. 2, as a comparative example, is a flowchart illustrating a sequence flow of a cleaning process in the plasma processing apparatus as shown in FIG. 1.

FIG. 3 is a diagram illustrating etching rate results according to each combination of gases used in the cleaning process examined in the present embodiment.

FIG. 4 is a diagram illustrating etching rate results indicating flow rate ratio dependency of added nitrogen ($N_2$) gas.

FIG. 5 is a flowchart illustrating a sequence flow of a cleaning process of the present embodiment performed in the plasma processing apparatus as shown in FIG. 1.

DESCRIPTION OF EMBODIMENTS

An embodiment of the present invention will be described with reference to the drawings.

FIG. 1 is a longitudinal cross-sectional view schematically illustrating a plasma processing apparatus 100 according to the embodiment of the present invention.

First, a configuration of the plasma processing apparatus 100 will be described with reference to FIG. 1. The plasma processing apparatus 100 as shown in FIG. 1 includes a vacuum container 101, and has a structure in which an exhaust opening is provided and a vacuum pump 1015 is connected from the opening through an exhaust pipe in order to depressurize the vacuum container 101 at a lower portion thereof. A pressure regulating valve 1016 is disposed on a path of the opening and the vacuum pump 1015 so as to adjust a flow rate or a speed of an exhaust gas by increasing or decreasing a flow path cross-sectional area of the path or the opening.

The vacuum container 101 generally includes a discharge unit 102 at an upper portion of the vacuum container and a processing chamber 104 at a lower portion of the vacuum container. The discharge unit 102 and the processing chamber 104 have cylindrical spaces, and central axes thereof are disposed at positions that are coaxial or that can be approximately regarded as coaxial. The discharge unit 102 and the processing chamber 104 are separated by a round dispersion plate 106, whose central axis is disposed at a position that is coaxial or that can be approximately regarded as coaxial. The discharge unit 102 and the processing chamber 104 communicate with each other through a plurality of through holes disposed concentrically in the dispersion plate 106.

A cylindrical quartz chamber 107 is provided in the discharge unit 102, and an ICP coil 108 is provided outside the quartz chamber 107. The ICP coil 108 is connected to a radio frequency power source 110 via a matching unit 109, and the plasma processing apparatus 100 can generate a plasma 1011 in an inductively coupled plasma (ICP) discharge mode. It is assumed that as a frequency of a radio frequency power of the radio frequency power source 110, a frequency band of several tens of MHz, such as 13.56 MHz, is used.

A top plate 1012 is provided above the discharge unit 102. A gas dispersion plate is provided below the top plate 1012, and a processing gas is introduced into the vacuum container 101 through the gas dispersion plate. A seal member, such as an O-ring, is sandwiched between the top plate 1012 and an upper surface of an upper end portion of a side wall of the discharge unit. Accordingly, the inside of the discharge unit 102 and the outside of the vacuum container 101 are sealed hermetically from each other.

A supply flow rate of the processing gas supplied from a processing gas source 1013 is adjusted by a mass flow controller 1014 provided for each gas type. As the processing gas, a combustible gas, a combustion-supporting gas, a mixed gas thereof, or a mixed gas thereof diluted with an inert gas is used. The processing gas source 1013 and the mass flow controller 1014 constitute a gas supply device.

In the processing chamber 104 at the lower portion of the vacuum container 101, a sample stage 103 on which a wafer 1017 is placed is disposed at a position that is coaxial or that can be approximately regarded as coaxial with the discharge unit 102 and the processing chamber 104.

An IR lamp unit (heating device) 105 is provided between the sample stage 103 and the discharge unit 102 so as to heat the wafer 1017. The IR lamp unit 105 mainly includes IR lamps 1018 for emitting IR light as an electromagnetic wave, a reflection plate 1019 for reflecting the IR light, and an IR light transmission window 1020.

Circle-type (circular) lamps are used as the IR lamps 1018. In addition, the IR lamps 1018 emit light mainly from visible light to light in an infrared light region (herein referred to as IR light). The IR lamps 1018 are connected to a lamp power source 1021 for supplying power, and a radio frequency cut-off filter 1022 for preventing noise of the radio frequency power applied to the ICP coil from flowing into the lamp power source is disposed between the IR lamps 1018 and the lamp power source 1021.

A plurality of (three in the drawing) IR lamps 1018 disposed on concentric circles are configured such that a magnitude of the power supplied to an arc-shaped portion of each can be independently adjusted, and radial distribution of a heating amount of the wafer 1017 can be adjusted.

The reflection plate 1019 is provided above the IR lamps 1018 so as to reflect the radially output IR light in a downward manner (toward a wafer installation direction).

The IR light transmission window 1020 made of quartz for transmitting the IR light is disposed from a lower surface to an inner peripheral side wall surface of the IR lamp unit 105.

A space inside an inner periphery of the IR lamp unit 105 is a flow path through which the plasma 1011 formed in the discharge unit 102 disposed above the space flows, and the dispersion plate 106 made of a dielectric body for shielding ions and electrons generated in the plasma and transmitting neutral particles and radicals of the gas is provided in the flow path.

Further, in the present embodiment, the dispersion plate 106 is also made of a permeable member such as quartz. The IR light emitted from an outer peripheral side of the dispersion plate 106 permeates through the dispersion plate 106 without being blocked by the dispersion plate 106, and most of the IR light reaches the inside of the processing chamber 104.

Next, an example in which a cleaning method is applied to the plasma processing apparatus is shown by using a flowchart of FIG. 2 as a comparative example.

The process starts from step 201, and in step 202, an etching process (a film-etching processing) is performed on a titanium (Ti)-containing film wafer. Thereafter, sulfur hexafluoride ($SF_6$) gas and argon (Ar) gas are supplied to the discharge unit 102 to perform discharge in step 203. At this time, a cleaning process is performed by introducing radicals generated by dissociation into the processing chamber 104, so that the radicals react with a silicon (Si)-based reaction product deposited in the processing chamber and are heated and desorbed by irradiation with the IR light from the IR lamps 1018. After that, in order to exhaust the reaction product floating in the processing chamber from the processing chamber 104, a purge is performed by increasing or decreasing an exhaust pressure by the pressure regulating valve 1016.

However, in the cleaning method by using the mixed gas obtained by diluting the sulfur hexafluoride ($SF_6$) gas with the argon (Ar) gas, a removal effect of the titanium (Ti)-based reaction product is low.

In view of this, the inventors considered that, in order to remove a titanium (Ti)-based reaction product generated when a titanium (Ti)-containing film wafer is processed, if the titanium (Ti)-based reaction product is made to react with radicals having high reactivity to generate a reaction product having high volatility, it may be possible to exhaust and remove the reaction product to the outside of the vacuum container.

Therefore, the inventors simulated the titanium (Ti)-based reaction product deposited in the processing chamber 104 and conducted an experiment to confirm an etching rate of the titanium (Ti)-containing film wafer. In this experiment, a titanium nitride (TiN) film wafer was tested as the titanium (Ti)-containing film wafer. If the etching rate is high, the reactivity with the titanium (Ti)-based reaction product becomes high, so that a cleaning effect is expected to be improved.

Next, experimental results for confirming the etching rate with each combination of gases illustrated in FIG. 3 are shown.

For comparison, when an etching rate confirmation experiment was performed by cleaning by using the mixed gas obtained by diluting the sulfur hexafluoride ($SF_6$) gas with the argon (Ar) gas, an etching rate result 301 of 4.2 nm/min was obtained.

Subsequently, an etching rate confirmation experiment of gas used for cleaning according to the present embodiment was performed. In the plasma processing apparatus of FIG. 1, a pressure in the chamber was set to 125 Pa or less by the vacuum pump 1015 and the pressure regulating valve 1016, and the experiment was performed under a condition that a source RF power was 800 W. Further, instead of the sulfur hexafluoride ($SF_6$) gas, nitrogen trifluoride ($NF_3$) gas, which is capable of obtaining the highest rate among fluorine-based gases, was used. By using nitrogen trifluoride ($NF_3$) gas, it is easy to react with the titanium (Ti)-based reaction product, which has high binding energy, and titanium tetrafluoride ($TiF_4$), which is highly volatile, can be generated and removed.

Further, titanium tetrachloride ($TiCl_4$) is generated by adding chlorine ($Cl_2$) gas having high reactivity with a metal film. Since titanium tetrachloride ($TiCl_4$) has a higher vapor pressure than titanium fluoride ($TiF_4$), the titanium (Ti)-based reaction product can be efficiently removed even at a low temperature portion.

Based on the above, a cleaning experiment by using a mixed gas of the nitrogen trifluoride ($NF_3$) gas, the chlorine ($Cl_2$) gas, and the argon (Ar) gas was performed, and an etching rate result 302 of 11.4 nm/min was obtained. Compared with the experimental result using the mixed gas of the sulfur hexafluoride ($SF_6$) gas and the argon (Ar) gas, it is understood that the etching rate was increased, and the cleaning effect on the titanium (Ti)-based reaction product was high.

Further, the inventors performed an etching rate confirmation experiment by adding nitrogen ($N_2$) gas to the mixed gas of the nitrogen trifluoride ($NF_3$) gas, the chlorine ($Cl_2$) gas, and the argon (Ar) gas. By adding the nitrogen ($N_2$) gas, it is possible to separate a bond of titanium nitride (TiN) into titanium (Ti) and nitrogen ($N_2$) and promote chlorination and fluorination of titanium (Ti).

In this manner, when a confirmation experiment was performed by cleaning by using a mixed gas of the nitrogen trifluoride ($NF_3$) gas, the chlorine ($Cl_2$) gas, the argon (Ar) gas, and the nitrogen ($N_2$) gas, an etching rate result 303 of 72.6 nm/min was obtained. By adding the nitrogen ($N_2$) gas, it became possible to further increase a rate of the titanium nitride (TiN).

Then, a confirmation experiment of the etching rate with respect to flow rate dependency on nitrogen ($N_2$) gas addition was performed. As shown in FIG. 4, as a result of the experiment, it was found that the etching rate was ensured even when a flow rate ratio of the nitrogen ($N_2$) gas to the mixed gas of the nitrogen trifluoride ($NF_3$) gas, the chlorine ($Cl_2$) gas, and the argon (Ar) gas was 0%.

In addition, as the flow rate ratio increased from 0%, the etching rate also increased and was maximized when the flow rate ratio reached 14%. Thereafter, it was clarified that the etching rate gradually decreases to a flow rate ratio of 30%. From the above, it was found that although the cleaning effect is enhanced by adding the nitrogen ($N_2$) gas, there is a possibility that efficient cleaning cannot be performed since the etching rate decreases if the nitrogen ($N_2$) gas is excessively added.

Therefore, the flow rate ratio of the nitrogen ($N_2$) gas to the mixed gas of the nitrogen trifluoride ($NF_3$) gas, the chlorine ($Cl_2$) gas, the argon (Ar) gas, and the nitrogen ($N_2$) gas is preferably set in a range of more than 0% and 30% or less.

An embodiment of cleaning the titanium (Ti)-based reaction product obtained as described above is shown in a flowchart of FIG. 5 as a vacuum processing method, but description of steps common to that shown in FIG. 2 will be omitted. However, it is preferable that cycle etching (including atomic layer etching (ALE)) is performed in a film etching step. Alternatively, etching by using a normal plasma may be used. According to the present embodiment, after step 203 which is a cleaning processing step, as step 501 which is a cleaning processing step, cleaning is performed by supplying the mixed gas of the nitrogen trifluoride ($NF_3$) gas, the chlorine ($Cl_2$) gas, the argon (Ar) gas, and the nitrogen ($N_2$) gas to the discharge unit 102 to perform discharge whose effect has been confirmed by the above experiment, and introducing radicals (or a plasma) generated by dissociation at this time into the processing chamber 104, reacting with the titanium (Ti)-based reaction product deposited in the processing chamber, and performing heating and desorption by the IR lamps 1018. Due to such cleaning, the titanium (Ti)-based reaction product adhered to and deposited in the chamber can be efficiently removed.

Further, although an inductively coupled plasma etching device is used in the present embodiment, the present invention is applicable regardless of a plasma generation method. For example, the present invention is also applicable to a helicon wave plasma etching apparatus, an ECR plasma etching apparatus using microwaves, a capacitively coupled plasma etching apparatus, and the like.

Further, the titanium (Ti)-based reaction product adhered to and deposited in the chamber can be efficiently removed as well by cleaning by using the plasma generated by the mixed gas of the nitrogen trifluoride ($NF_3$) gas, the chlorine ($Cl_2$) gas, and the argon (Ar) gas or the mixed gas of the nitrogen trifluoride (NF$_3$) gas, the chlorine (Cl$_2$) gas, the argon (Ar) gas, and the nitrogen (N$_2$) gas.

The embodiments described above have been described in detail for easy understanding of the present invention, and are not necessarily limited to those having all the described configurations. Further, part of the configuration of one embodiment can be replaced with the configuration of another embodiment, or the configuration of one embodiment can be added with the configuration of another embodiment. In addition, part of the configuration of each embodiment can be added, deleted, or replaced with other configurations.

REFERENCE SIGN LIST

100: plasma processing apparatus
101: vacuum container
102: discharge unit
104: processing chamber
105: IR lamp unit
106: dispersion plate
107: quartz chamber
108: ICP coil
109: matching unit
110: radio frequency power source
1011: plasma
1012: top plate
1015: vacuum pump
1016: pressure regulating valve
1017: wafer
1018: IR lamp
1019: reflection plate
1020: IR light transmission window
1021: lamp power source
1022: radio frequency cut-off filter

The invention claimed is:

1. A vacuum processing method for etching a titanium-containing film in a processing chamber, the vacuum processing method comprising:
   a step of etching the film; and
   a step of cleaning an inside of the processing chamber by using a mixed gas of nitrogen trifluoride (NF) gas, argon (Ar) gas, chlorine (Cl) gas, and (N$_2$) gas,
   wherein said step of cleaning further comprises setting a flow rate ratio of the nitrogen (N$_2$) gas to the mixed gas of the nitrogen trifluoride (NF$_3$) gas, the argon (Ar) gas, and the chlorine (Cl$_2$) gas to be between 0% and 30% to provide a maximum cleaning effect of a titanium-based reaction product.

2. The vacuum processing method according to claim 1, wherein
   the etching of the film is cycle etching, and
   the step of cleaning the inside of the processing chamber is cleaning the inside of the processing chamber with radicals generated by using the mixed gas.

3. The vacuum processing method according to claim 1, wherein
   the etching of the film is etching by using a plasma, and
   the step of cleaning the inside of the processing chamber is cleaning the inside of the processing chamber with a plasma generated by using the mixed gas.

4. The vacuum processing method according to claim 1, further comprising:
   a step of cleaning the inside of the processing chamber by using a mixed gas of sulfur hexafluoride (SF$_6$) gas and argon (Ar) gas before the step of cleaning the inside of the processing chamber.

5. The vacuum processing method according to claim 4, wherein
   the step of cleaning the inside of the processing chamber by using the mixed gas of the sulfur hexafluoride (SF$_6$) gas and the argon (Ar) gas is supplying radicals generated by using the mixed gas of the sulfur hexafluoride (SF$_6$) gas and the argon (Ar) gas to the inside of the processing chamber, and cleaning the inside of the processing chamber while irradiating with light.

* * * * *

UNITED STATES PATENT AND TRADEMARK OFFICE
CERTIFICATE OF CORRECTION

PATENT NO. : 11,961,719 B2
APPLICATION NO. : 17/435127
DATED : April 16, 2024
INVENTOR(S) : Nozomu Yoshioka, Kazumasa Okuma and Takao Arase It is certified that error appears in the above-identified patent and that said Letters Patent is hereby corrected as shown below:

In the Claims

1. In Claim 1, at Column 8, Line number 3, please delete "(NF)" and replace with "($NF_3$)"; and 2. In Claim 1, at Column 8, Line number 4, please delete "(Cl)" and replace with "($Cl_2$)".

Signed and Sealed this
Nineteenth Day of August, 2025

Coke Morgan Stewart
*Acting Director of the United States Patent and Trademark Office*